(12) United States Patent
Lee

(10) Patent No.: US 11,238,931 B2
(45) Date of Patent: Feb. 1, 2022

(54) SEMICONDUCTOR DEVICE AND OPERATING METHOD OF SEMICONDUCTOR DEVICE

(71) Applicant: SK hynix Inc., Gyeonggi-do (KR)

(72) Inventor: Hee Youl Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/070,238

(22) Filed: Oct. 14, 2020

(65) Prior Publication Data

US 2021/0358550 A1 Nov. 18, 2021

(30) Foreign Application Priority Data

May 15, 2020 (KR) .................. 10-2020-0058488

(51) Int. Cl.
*G11C 16/04* (2006.01)
*G11C 16/10* (2006.01)
*H01L 27/11582* (2017.01)
*H01L 27/11556* (2017.01)

(52) U.S. Cl.
CPC .......... *G11C 16/0483* (2013.01); *G11C 16/10* (2013.01); *H01L 27/11556* (2013.01); *H01L 27/11582* (2013.01)

(58) Field of Classification Search
CPC .................................................. G11C 16/0483

USPC .................................................... 365/185.17
See application file for complete search history.

(56) References Cited

U.S. PATENT DOCUMENTS

2016/0027504 A1* 1/2016 Lee .................... G11C 16/3459
365/185.03

FOREIGN PATENT DOCUMENTS

KR 10-2016-0059747 5/2016
KR 10-1635502 7/2016

* cited by examiner

*Primary Examiner* — Jason Lappas
(74) *Attorney, Agent, or Firm* — IP & T Group LLP

(57) ABSTRACT

A method of operating a semiconductor device includes applying a first voltage to a first source select line coupled to first source select transistors of memory strings included in an unselected memory block, among memory blocks, floating the first source select line after the first voltage is applied thereto, applying a second voltage having a lower voltage level than the first voltage to a second source select line coupled to second source select transistors of the memory strings included in the unselected memory block, applying a precharge voltage to a common source line, and applying a program voltage to a word line coupled to selected memory cells of memory strings included in a selected memory block, among the memory blocks.

20 Claims, 14 Drawing Sheets

SEMICONDUCTOR DEVICE AND OPERATING METHOD OF SEMICONDUCTOR DEVICE

CROSS-REFERENCE TO RELATED APPLICATION

The present application claims priority under 35 U.S.C. § 119(a) to Korean patent application number 10-2020-0058488 filed on May 15, 2020, the entire disclosure of which is incorporated by reference herein.

BACKGROUND

1. Technical Field

Various embodiments of the present disclosure generally relate to an electronic device and, more particularly, to a semiconductor device and a method of operating the semiconductor device.

2. Related Art

A semiconductor device may include a memory device configured to store data, and output the stored data. The memory device may be a volatile memory that loses its stored data in the absence of a power supply. Examples of a volatile memory device may include a static random-access memory (SRAM), a dynamic RAM (DRAM), a synchronous DRAM (SDRAM), and the like. However, the memory device may also be a non-volatile memory device that retains its stored data even when it is not powered. Examples of a non-volatile memory device include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like.

The memory device may include a memory cell array storing data, a peripheral circuit performing various operations such as program, read and erase operations, and a control logic controlling the peripheral circuit. The memory device may include memory cells that are two-dimensionally or three-dimensionally arranged over a substrate.

SUMMARY

Various embodiments of the present disclosure are directed to a semiconductor device having improved operating characteristics.

According to an embodiment, a method of operating a semiconductor device including memory blocks sharing a common source line, each of the memory blocks including memory strings each including a first source select line, a second source select line and memory cells. The method may include applying a first voltage to a first source select line coupled to first source select transistors of memory strings included in an unselected memory block, among the memory blocks, floating the first source select line after the first voltage is applied thereto, applying a second voltage having a lower voltage level than the first voltage to a second source select line coupled to second source select transistors of the memory strings included in the unselected memory block, applying a precharge voltage to the common source line, and applying a program voltage to a word line coupled to selected memory cells of memory strings included in a selected memory block, among the memory blocks.

According to an embodiment, a method of operating a semiconductor device including memory blocks sharing a common source line, each of the memory blocks including memory strings coupled between the common source line and bit lines, each of the memory strings including a first group of source select transistors, a second group of source select transistors, and memory cells, wherein the first group is coupled between the common source line and the second group. The method may include applying a positive voltage to a first source select line coupled to a first group of memory strings included in an unselected memory block, among the memory blocks, floating the first source select line after the positive voltage is applied thereto, applying a voltage for turning off the second group to a second source select line coupled to a second group of memory cell strings included in the unselected memory block, applying a precharge voltage to the common source line, and applying a program voltage to a word line coupled to selected memory cells of memory strings included in a selected memory block, among the memory blocks.

These and other features and advantages of the present invention will become better understood by those with ordinary skill in the art of the present invention from the following figures and detailed description.

DETAILED DESCRIPTION

Hereinafter, specific structural or functional descriptions of various embodiments of the present disclosure are disclosed in this specification. However, the embodiments are not limited only to the presented embodiments described in this specification.

Figure 1:
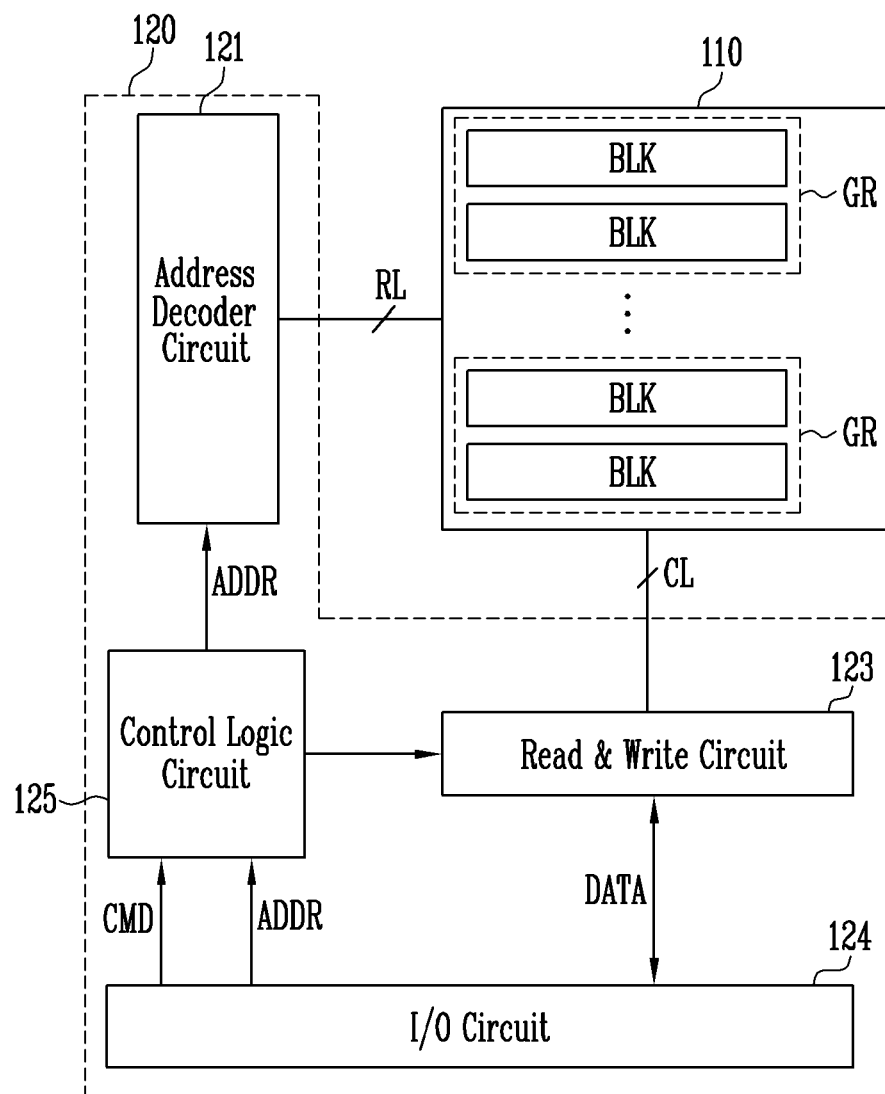
FIG. 1 is a simplified block diagram illustrating the configuration of a semiconductor device according to an embodiment of the present disclosure.

FIG. 1 is a simplified block diagram illustrating the configuration of a semiconductor device 100 according to an embodiment of the present disclosure.

Referring to FIG. 1, the semiconductor device 100 may include a cell array 110 and a peripheral circuit 120. The peripheral circuit 120 may include an address decoder circuit 121, a read and write circuit 123, an input/output circuit 124 and a control logic circuit 125. The semiconductor device 100 may be a memory device. The semiconductor device 100 may be a volatile memory device. The semiconductor device 100 may be a non-volatile memory device. For example, in an embodiment, the semiconductor device 100 may be a flash memory device.

The cell array 110 may be coupled to an address decoder circuit 121 through row lines RL and to a read and write circuit 123 through column lines CL. The row lines RL may be word lines and the column lines CL may be bit lines. However, the word lines and the bit lines may be determined relative to each other. In other words, the row lines may be bit lines and the column lines may be word lines.

The cell array 110 may include one or more planes. Each plane may include a plurality of memory blocks. Each of the memory blocks may include memory strings. Further, each of the memory blocks may include a plurality of pages.

The control logic circuit 125 may be coupled to the address decoder circuit 121, the read and write circuit 123 and the input/output circuit 124. The control logic circuit 125 may receive a command CMD and an address ADDR from the input/output circuit 124. The control logic circuit 125 may control the address decoder circuit 121 and the read and write circuit 123 to perform an internal operation in response to the received command CMD.

The address decoder circuit 121 may be coupled to the cell array 110 through the row lines RL. For example, the address decoder circuit 121 may be coupled to the cell array 110 through a word line, a dummy word line, a source select line, and a drain select line. In addition, the address decoder circuit 121 may be configured to control the row lines RL in response to the control logic circuit 125. Therefore, the address decoder circuit 121 may receive the address ADDR from the control logic circuit 125 and select one of the memory blocks of the cell array 110 in response to the received address ADDR.

A program operation and a read operation of the semiconductor device 100 may be performed in units of pages. Therefore, during a program operation and a read operation, the address ADDR may include a block address and a row address. The address decoder circuit 121 may decode the block address included in the received address ADDR. The address decoder circuit 121 may generate a block selection signal in response to the decoded block address and select a memory block according to the block selection signal.

The address decoder circuit 121 may decode the row address included in the received address ADDR and select a page of the selected memory block according to the decoded row address.

An erase operation of the semiconductor device 100 may be performed in units of memory blocks. Therefore, during an erase operation, the address ADDR may include a block address. The address decoder circuit 121 may decode the block address included in the received address ADDR. The address decoder circuit 121 may select a memory block according to the decoded block address.

The read and write circuit 123 may be coupled to the cell array 110 through the column lines CL. The read and write circuit 123 may include page buffers. The page buffers may access the cell array 110 through the column lines CL.

During a program operation, the read and write circuit 123 may transfer data DATA received from the input/output circuit 124 to the column lines CL, and memory cells of the selected page may be programmed in response to the transferred data DATA. The data DATA may be multi-bit data to be programmed into each of the memory cells. During a read operation, the read and write circuit 123 may read the data DATA from the memory cells of the selected page through the column lines CL and may output the read data DATA to the input/output circuit 124. During an erase operation, the read and write circuit 123 may float the column lines CL. The program operation and the erase operation may include a verify operation. The verify operation may be performed in a similar manner to the read operation.

Figure 2:
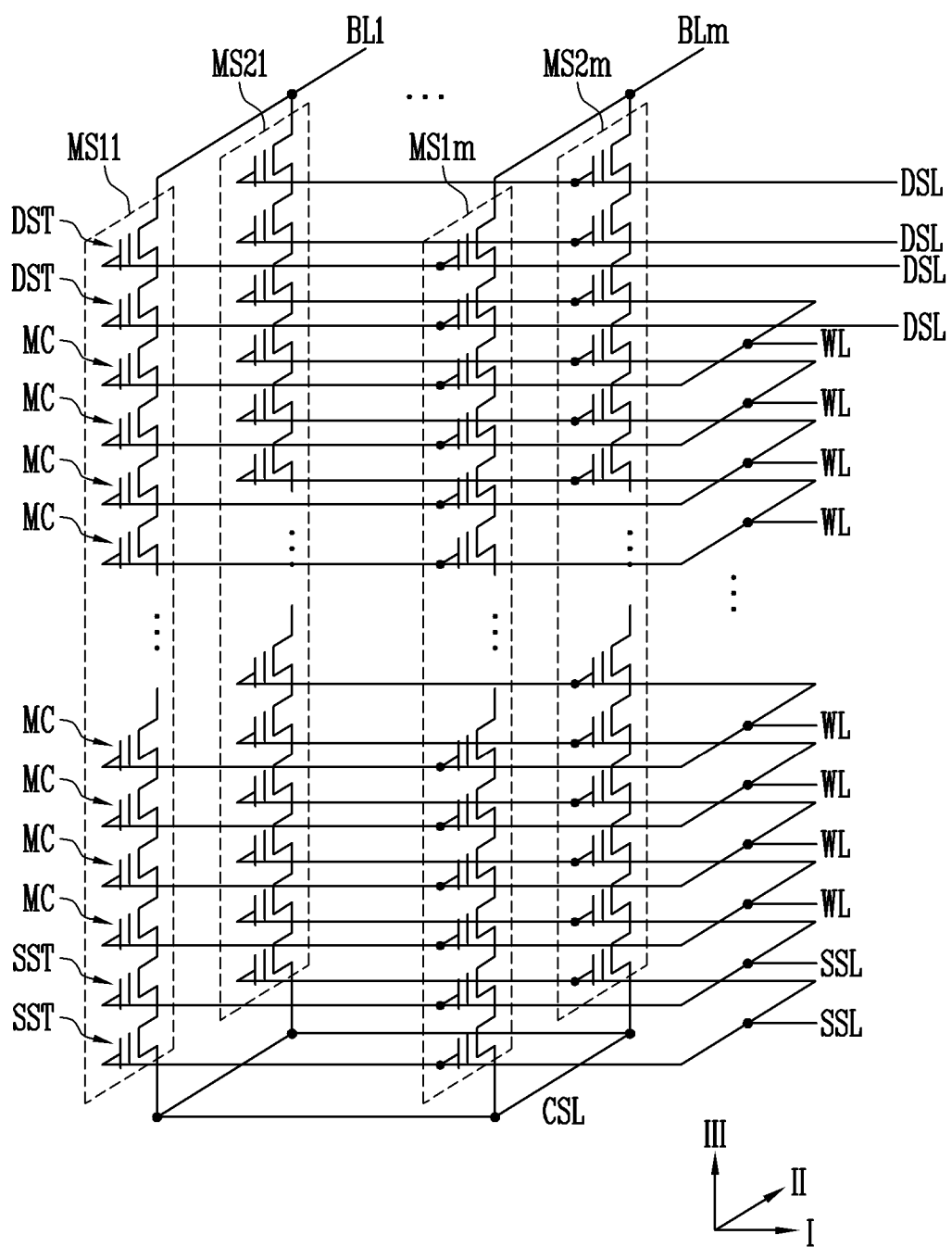
FIG. 2 is a circuit diagram illustrating a cell array structure of a semiconductor device according to an embodiment of the present disclosure.

FIG. 2 is a circuit diagram illustrating a cell array structure of a semiconductor device according to an embodiment of the present disclosure.

Referring to FIG. 2, a cell array may include a plurality of memory blocks BLK. The memory blocks BLK may be arranged in a first direction I, a second direction II crossing the first direction I, or the first and second directions I and II. In addition, the memory blocks BLK may be stacked on each other in a third direction III. The memory blocks BLK may share a common source line CSL.

Each of the memory blocks BLK may include a plurality of memory strings MS11 to MS1$m$ and MS21 to MS2$m$. Each of the memory strings MS11 to MS1$m$ and MS21 to MS2$m$ may extend in the third direction III. Memory cells MC may be stacked on each other in the third direction III, where 'm' is an integer of 2 or more.

The memory block BLK may include the memory strings MS11 to MS1$m$ and MS21 to MS2$m$ coupled between bit lines BL1 to BLm and the common source line CSL. The memory strings MS11 to MS1$m$ and MS21 to MS2$m$ arranged in the second direction II may share the bit lines BL1 to BLm.

Each of the memory strings MS11 to MS1$m$ and MS21 to MS2$m$ may include at least one source select transistor SST, the plurality of memory cells MC and at least one drain select transistor DST.

The source select transistors SST included in one of the memory strings MS11 to MS1$m$ and MS21 to MS2$m$ may be coupled in series between the memory cell MC and the common source line CSL. Gate electrodes of the source select transistors SST may be coupled to source select lines SSL. In addition, the source select transistors SST in the same level may be coupled to the same source select line SSL, or different source select lines SSL.

The memory cells MC included in one of the memory strings MS11 to MS1$m$ and MS21 to MS2$m$ may be coupled in series between the source select transistor SST and the drain select transistor DST. Gate electrodes of the memory cells MC may be coupled to word lines WL, and the memory cells MC in the same level may be coupled to the same word line WL. Word line voltages (program bias, pre-program bias and read bias) necessary for driving may be applied to each of the word lines WL.

At least one drain select transistor DST included in one of the memory strings MS11 to MS1$m$ and MS21 to MS2$m$ may be coupled in series between the bit lines BL1 to BLm and the memory cell MC. Gate electrodes of the drain select transistors DST may be coupled to drain select lines DSL. The drain select transistors DST in the same level, among the drain select transistors DST of the memory strings MS11 to MS1*m* and MS21 to MS2*m* arranged in the same row (first direction I), may be coupled to the same drain select line DSL. In addition, the drain select transistors DST arranged in different rows (first direction I) may be coupled to different drain select lines DSL.

Though not shown in FIG. 2, each of the memory strings MS11 to MS1*m* and MS21 to MS2*m* may include a pipe transistor. For example, each of the memory strings MS11 to MS1*m* and MS21 to MS2*m* may include the plurality of source select transistors SST, the plurality of memory cells MC, at least one pipe transistor PT, the plurality of memory cells MC, and at least one drain select transistor DST which are coupled in series with each other. In this example, each of the memory strings MS11 to MS1*m* and MS21 to MS2*m* may be arranged in a U shape.

Figure 3A:
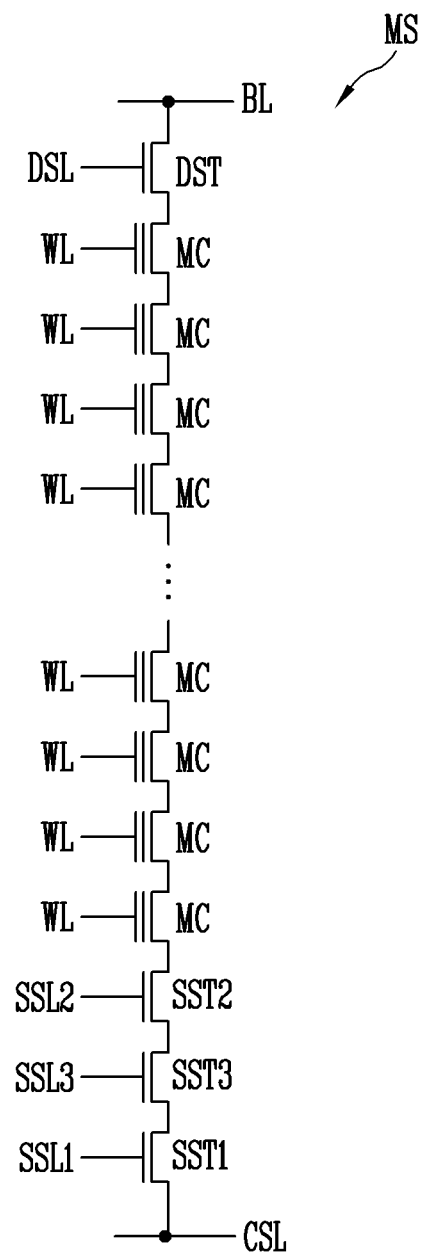
FIGS. 3A to 3C are diagrams illustrating the configuration of a memory string according to an embodiment of the present disclosure.
Figure 3B:
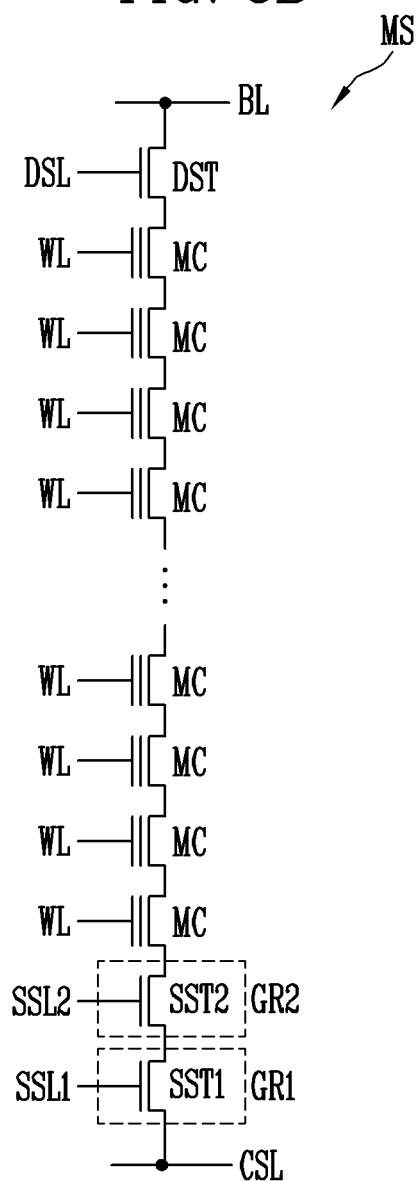
Figure 3C:
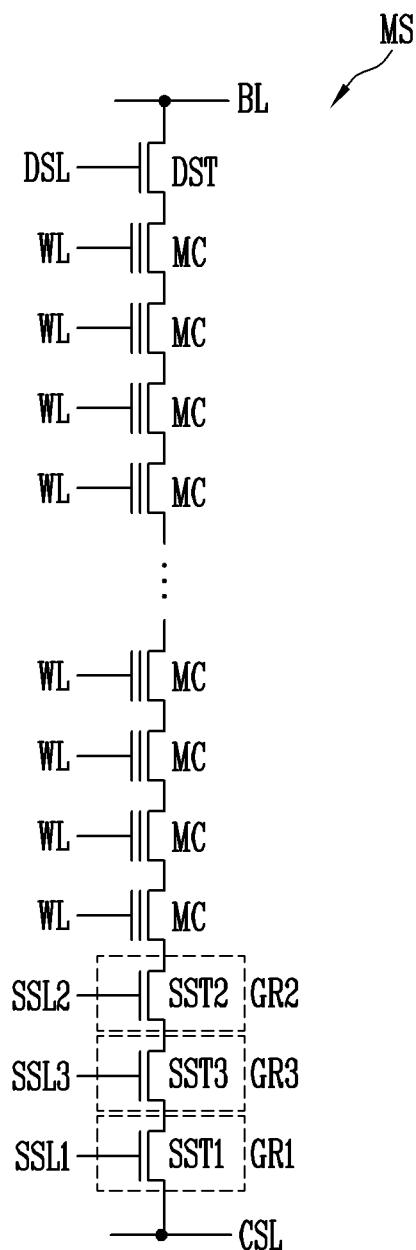

FIGS. 3A to 3C are diagrams illustrating the configuration of a memory string MS according to an embodiment of the present disclosure. A description of the common contents discussed above is omitted for the sake of brevity.

Referring to FIG. 3A, the memory string MS may include a first source select transistor SST1 and a second source select transistor SST2. The first source select transistor SST1 may be located closer to the common source line CSL than the second source select transistor SST2. More specifically, the first source select transistor SST1 may be located relatively adjacent to the common source line CSL, while the second source select transistor SST2 may be located relatively adjacent to a bit line BL.

The first source select line SSL1 may be coupled to the first source select transistor SST1. The second source select line SSL2 may be coupled to the second source select transistor SST2. The first source select line SSL1 and the second source select line SSL2 may be electrically isolated from and driven independently of each other.

The memory string MS may further include a third source select transistor SST3. The third source select transistor SST3 may be coupled between the first source select transistor SST1 and the second source select transistor SST2. A third source select line SSL3 may be coupled to the third source select transistor SST3. The third source select line SSL3 may be electrically isolated from and driven independently of the first source select line SSL1 and the second source select line SSL2.

As described in connection with this embodiment, the memory string MS may include the three source select transistors, i.e., the first to third source select transistors SST1 to SST3. However, the embodiment is not limited thereto. The number of source select transistors included in the memory string MS may vary. For example, two or more source select transistors may be included in the memory string MS.

Referring to FIG. 3B, the memory string MS may include one or more first source select transistors SST1 and one or more second source select transistors SST2. The first and second source select transistors SST1 and SST2 included in the memory string MS may be divided into a plurality of groups. More specifically, the memory string MS may include a first group GR1 including the first source select transistors SST1 and a second group GR2 including the second source select transistors SST2. The number of first source select transistors SST1 included in the first group GR1 and the number of second source select transistors SST2 included in the second group GR2 may be the same or different.

The first group GR1 may be closer to the common source line CSL than the second group GR2. The first group GR1 may be coupled between the common source line CSL and the second group GR2.

The first group GR1 may be coupled to at least one first source select line SSL1 and the second group GR2 may be coupled to at least one second source select line SSL2. At least one first source select line SSL1 and at least one second source select line SSL2 may be electrically isolated from and driven independently of each other.

Referring to FIG. 3C, the memory string MS may further include a third group GR3. The third group GR3 may be coupled between the first group GR1 and the second group GR2. The third group GR3 may include at least one third source select transistor SST3. The number of first source select transistors SST1 included in the first group GR1, the number of second source select transistors SST2 included in the second group GR2, and the number of third source select transistors SST3 included in the third group GR3 may be the same or different from each other.

The third group GR3 may be coupled to at least one third source select line SSL3. At least one third source select line SSL3 may be electrically isolated from and driven independently of the first and second source select lines SSL1 and SSL2.

As described in connection with this embodiment, the memory string MS may include the three groups, i.e., the first to third groups GR1 to GR3. However, the embodiment is not limited thereto. The number of groups included in the memory string MS may vary. For example, two or more groups may be included in the memory string MS.

Figure 4A:
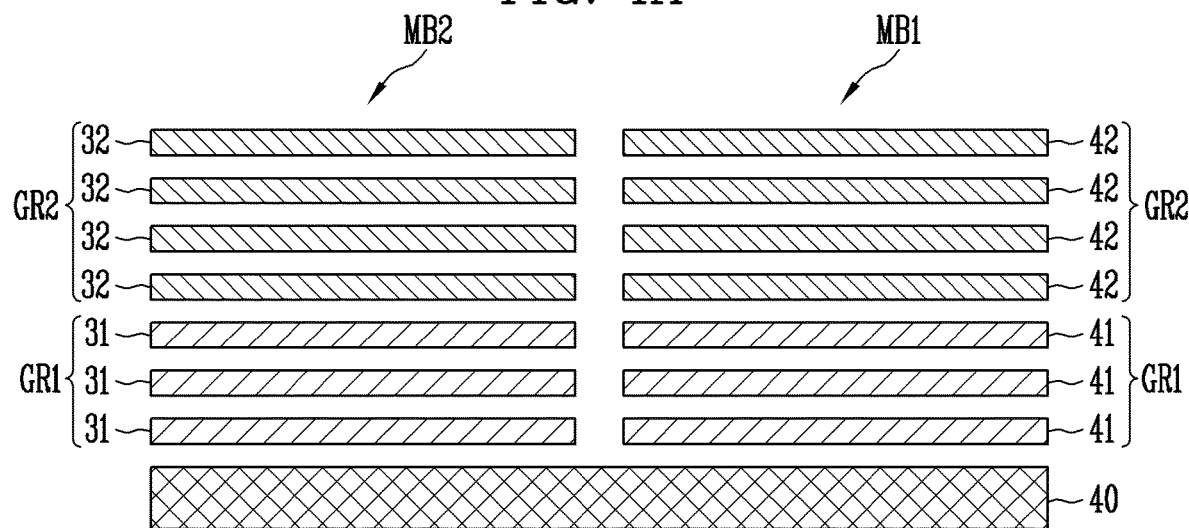
FIGS. 4A to 4C are cross-sectional diagrams of the structure of a semiconductor device according to an embodiment of the present disclosure.
Figure 4B:
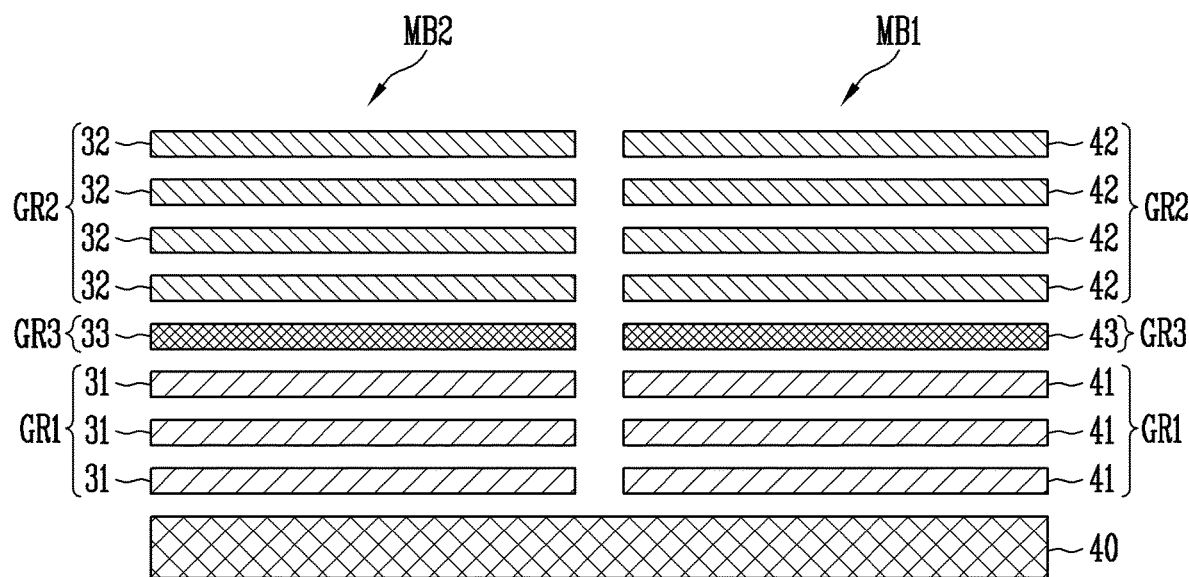
Figure 4C:
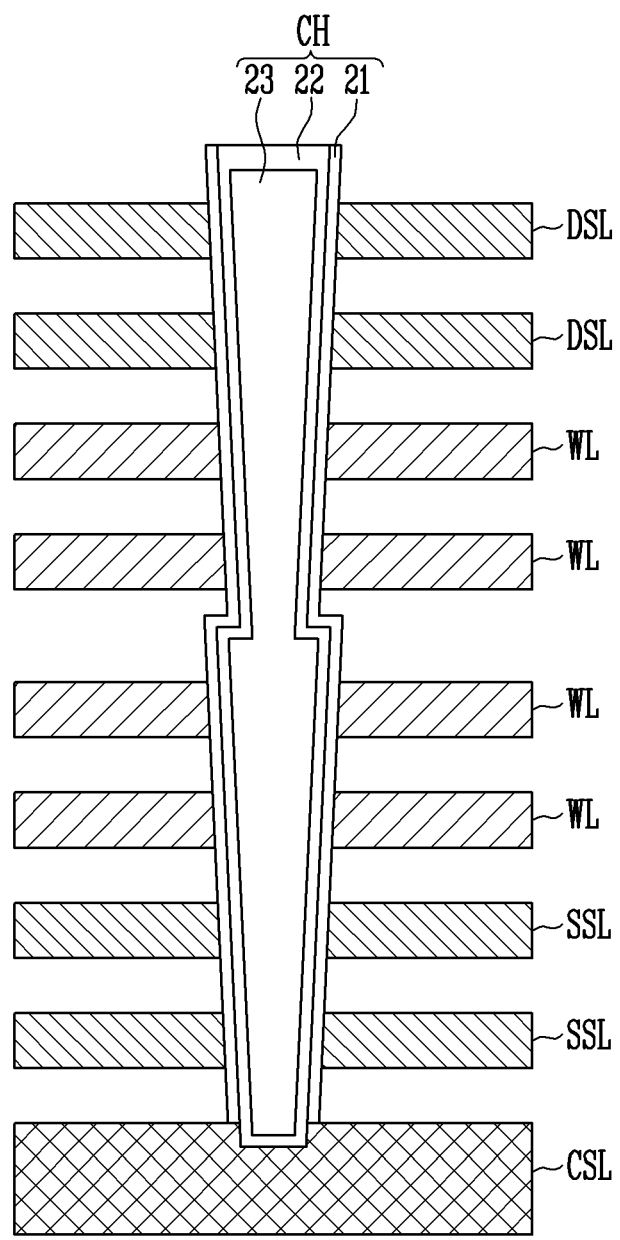

FIGS. 4A to 4C are cross-sectional diagrams of the structure of a semiconductor device according to an embodiment of the present disclosure. FIGS. 4A and 4B mainly illustrate conductive lines such as a common source line and a source select line. FIG. 4C mainly illustrates a conductive line and a channel structure. However, the other elements are not illustrated in FIGS. 4A to 4C.

Referring to FIG. 4A, a semiconductor device may include a common source line 40, a first memory block MB1 and a second memory block MB2.

The first memory block MB1 may include first source select lines 41 and second source select lines 42. The first source select lines 41 may belong to the first group GR1 and the second source select lines 42 may belong to the second group GR2. The second source select lines 42 may be located above the first source select lines 41. The first source select lines 41 may be located between the second source select lines 42 and the common source line 40.

The second memory block MB2 may include first source select lines 31 and second source select lines 32. The first source select lines 31 may belong to the first group GR1 and the second source select lines 32 may belong to the second group GR2. The second source select lines 32 may be located above the first source select lines 31. The first source select lines 31 may be located between the second source select lines 32 and the common source line 40.

The first source select lines 41 of the first memory block MB1 may be electrically isolated from and driven independently of the first source select lines 31 of the second memory block MB2. The second source select lines 42 of the first memory block MB1 may be electrically isolated from and driven independently of the second source select lines 32 of the second memory block MB2.

Referring to FIG. 4B, the first memory block MB1 may further include at least one third source select line 43. The second memory block MB2 may further include at least one third source select line 33. The third source select line 43 of the first memory block MB1 may be electrically isolated from and driven independently of the third source select line 33 of the second memory block MB2.

Though not shown in FIGS. 4A and 4B, the first and second memory blocks MB1 and MB2 may further include, a word line, a drain select line, a channel structure and the like. Referring to FIG. 4C, the semiconductor device may include the common source line CSL, the source select lines SSL, the word lines WL, the drain select lines DSL and a channel structure CH. The source select lines SSL, the word lines WL, the drain select lines DSL and the channel structure CH may be sequentially stacked over the common source line CSL. The source select lines SSL may include the first to third source select lines 31 to 33 or the first to third source select lines 41 to 43 as described above.

The channel structure CH may pass through the source select lines SSL, the word lines WL and the drain select lines DSL in a stacking direction. The channel structure CH may include a channel layer 22 and further include a memory layer 21 and a core insulating layer 23. The memory layer 21 may be formed to surround a sidewall of the channel layer 22. The memory layer 21 may include at least one of a tunnel insulating layer, a data storage layer and a blocking layer. The data storage layer may include a floating gate, a charge trapping material, polysilicon, a nitride, a variable resistance material, a phase change material, a nanostructure, or the like. The channel layer 22 may refer to a layer where a channel region of a select transistor, a memory cell, and the like is formed, and may include a semiconductor material, a nanostructure, or the like. The channel layer 22 may extend into the common source line CSL.

According to the above-described structure of the semiconductor device, source select transistors may be located at intersections between the channel structure CH and the source select lines SSL, memory cells may be located at intersections between the channel structure CH and the word lines WL, and drain select transistors may be located at intersections between the channel structure CH and the drain select lines DSL.

The source select lines SSL may be located adjacent to the common source line CSL. In addition, an insulating layer (not shown) may be interposed between the lowermost source select line SSL and the common source line CSL. Therefore, capacitance may be caused between the lowermost source select line SSL and the common source line CSL.

FIGS. 5A to 5D are diagrams illustrating a method of operating a semiconductor device according to an embodiment of the present disclosure. FIGS. 5A to 5D each show a precharge operation of an unselected memory block, among a plurality of memory blocks. A channel region of a memory string in a selected memory block may be precharged with charges by a precharge operation. The precharge operation may be part of a program operation. The precharge operation may be performed before a program voltage is applied. Operations of the memory block and the memory string as described above with reference to FIGS. 2 to 4C will be described below.

Figure 5A:
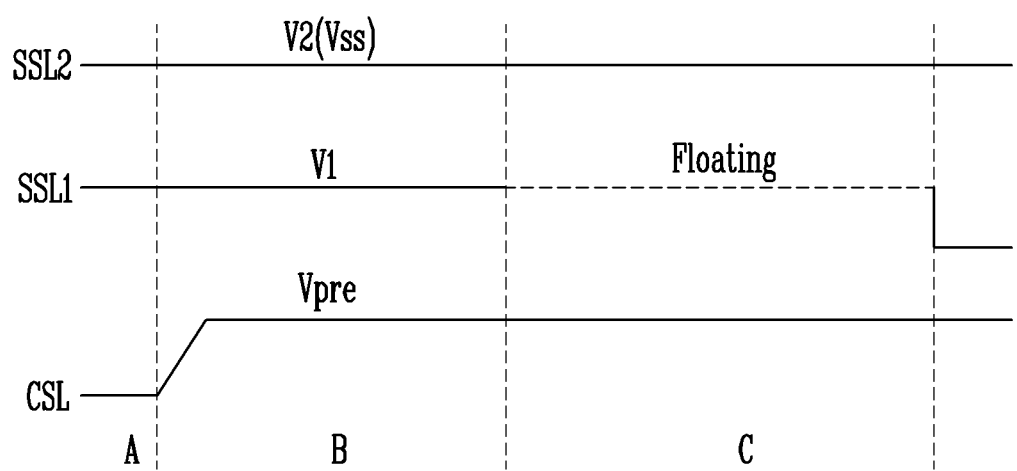
FIGS. 5A to 5D are diagrams illustrating a method of operating a semiconductor device according to an embodiment of the present disclosure.

Referring to FIG. 5A, in a section A, a first voltage V1 may be applied to the first source select line SSL1 coupled to the first source select transistors of the memory strings included in the unselected memory block. The first voltage V1 may be applied to at least one first source select line SSL1 coupled to the first group GR1. A second voltage V2 may be applied to the second source select line SSL2 coupled to the second source select transistors of the memory strings. The second voltage V2 may be applied to the second source select lines SSL2 coupled to the second group GR2. The common source line CSL may be in an initial state and have a ground level.

The second voltage V2 may have a lower voltage level than the first voltage V1. According to an embodiment, the first voltage V1 may be a positive voltage and the second voltage V2 may be a ground voltage Vss. In the section A, the second source select transistors may be turned off. Therefore, the memory strings may be electrically insulated from the common source line CSL. The first source select transistors may be turned on or off depending on the voltage level of the first voltage V1. Even when the first source select transistors are turned on, since the second source select transistors are turned off, the memory strings may be separated from the common source line CSL.

In a section B, a precharge voltage Vpre may be applied to the common source line CSL. When the first voltage V1 is applied to the first source select line SSL1 and the second voltage V2 is applied to the second source select line SSL2, a voltage level of the common source line CSL may increase to a precharge level. The voltage level of the first voltage V1 may be equal to or lower than that of the precharge voltage Vpre.

The first source select line SSL1 may be located between the second source select line SSL2 and the common source line CSL. Therefore, when the voltage level of the common source line CSL increases, the common source line CSL may be affected by the capacitance between the first source select line SSL1 and the common source line CSL. When the first source select line SSL1 has a ground level, if the precharge voltage Vpre is applied to the common source line CSL, the voltage level of the common source line CSL may increase slowly due to the capacitance. On the other hand, according to an embodiment, when the first voltage V1 is applied to the first source select line SSL1, the precharge voltage Vpre may be applied to the common source line CSL. Therefore, the voltage level of the common source line CSL may quickly increase by the capacitance between the first source select line SSL1 and the common source line CSL. As a result, the loading time of the common source line CSL may be reduced.

In a section C, the first source select line SSL1 may be floated. When the voltage level of the common source line CSL reaches the precharge level and the channel region of the memory strings of the selected memory block is precharged, the first source select line SSL1 may be floated. By floating the first source select line SSL1, power consumption of the semiconductor device may be reduced. The voltage levels of the second source select line SSL2 and the common source line CSL may be maintained.

According to the above-described operation, the common source line CSL may be prevented from being charged slowly by the unselected memory blocks during the precharge operation. Therefore, the charging time of the common source line CSL may be reduced and program time may be reduced.

Figure 5B:
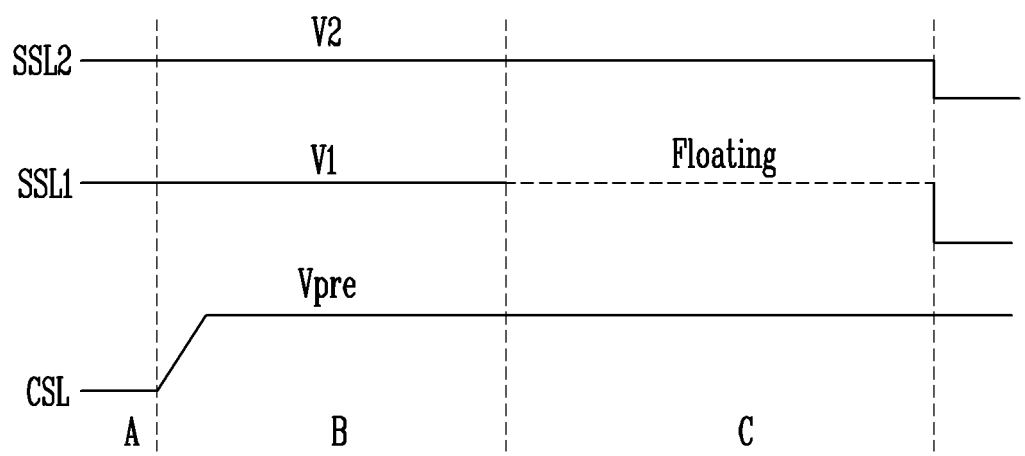

FIG. 5B is similar to FIG. 5A and shows an embodiment in which the second voltage V2 applied to the second source select line SSL2 has a positive level. The second voltage V2 may have a lower voltage level than threshold voltages of the second source select transistors. According to an embodiment, the first voltage V1 may be a first positive voltage and the second voltage V2 may be a second positive voltage having a lower voltage level than the first voltage V1.

Even when the second positive voltage is applied to the second source select line SSL2, the second source select transistors may be turned off. Therefore, regardless of on/off states of the first source select transistors, the memory strings may be electrically insulated from the common source line CSL.

Figure 5C:
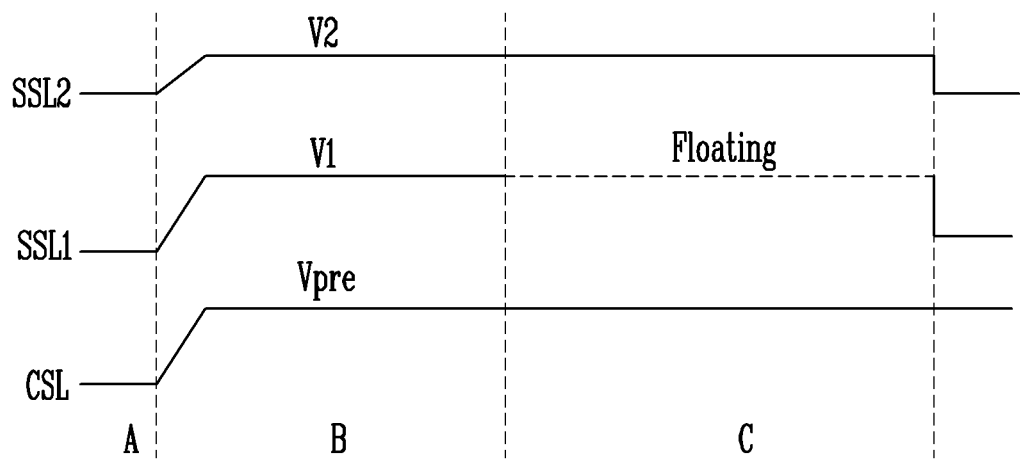

FIG. 5C is similar to FIG. 5A or 5B and illustrates a modified embodiment where the voltage levels of the first source select line SSL1 and the second source select line SSL2 increase at different times from those of FIG. 5A or 5B. In a section B, the first voltage V1 may be applied to the first source select line SSL1, the second voltage V2 may be applied to the second source select line SSL2, and the precharge voltage Vpre may be applied to the common source line CSL. The second voltage V2 may have a lower voltage level than the first voltage V1. According to an embodiment, the second voltage V2 may be the ground voltage Vss or a positive voltage.

The first voltage V1 or the second voltage V2 may be applied at the same time as the precharge voltage Vpre. Alternatively, both the first voltage V1 and the second voltage V2 may be applied at the same time as the precharge voltage Vpre. As a result, either the voltage level of the first source select line SSL1 or the voltage level of the second source select line SSL2 may increase at the same time as that of the third source select line SSL3.

Figure 5D:
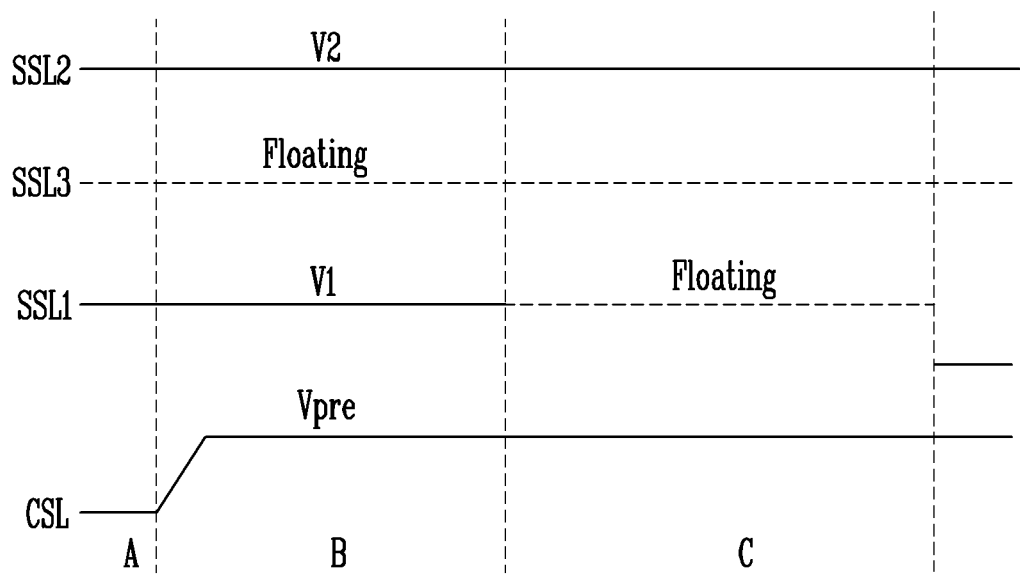

FIG. 5D is similar to FIG. 5A, 5B or 5C and shows an embodiment in which a memory string includes a third source select transistor coupled between a first source select transistor and a second source select transistor. In sections A, B, and C, the third source select line SSL3 coupled to the third source select transistors of the memory strings included in the unselected memory block may be floated.

When the first voltage V1 is applied to the first source select line SSL1, the second voltage V2 is applied to the second source select line SSL2, and the third source select line SSL3 is floated, the voltage level of the common source line CSL may increase to a precharge level. When there is a large difference in voltage level between the first source select line SSL1 and the second source select line SSL2, the semiconductor device may not function properly, or carriers may be moved. Therefore, according to an embodiment of the present disclosure, the third source select line SSL3 between the first source select line SSL1 and the second source select line SSL2 may be floated. Since the floated third source select line SSL3 functions as a buffer therebetween, an erroneous operation or inadvertent carrier movement may be reduced or avoided.

Figure 6:
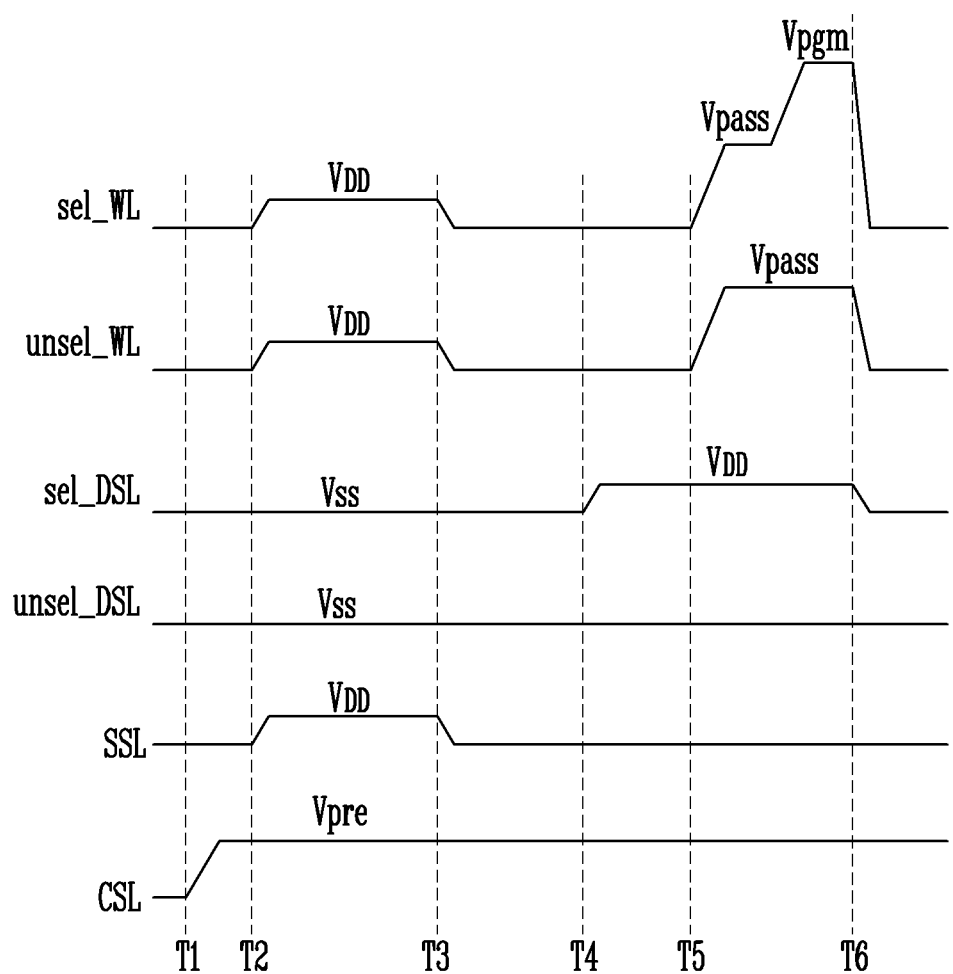
FIG. 6 is a diagram illustrating a method of operating a semiconductor device according to an embodiment of the present disclosure.

FIG. 6 is a diagram illustrating a method of operating a semiconductor device. A program operation of a selected memory block, among a plurality of memory blocks, is shown in FIG. 6. The source select line SSL may correspond to the first source select line SSL1, the second source select line SSL2, or the third source select line SSL3 as described above with reference to FIGS. 1 to 4C.

At a first time T1, the precharge voltage Vpre may be applied to the common source line CSL.

At a second time T2, a power supply voltage VDD may be applied to the source select line SSL of a selected memory block, among a plurality of memory blocks, and source select transistors may be turned on. The power supply voltage VDD may be applied to unselected word lines unsel_WL and a selected word line sel_WL and memory cells may be turned on. The ground voltage Vss may be applied to drain select lines (sel_DSL and unsel_DSL) and drain select transistors may be turned off. As a result, memory strings may be electrically coupled to the common source line CSL and separated from the bit line BL. In addition, a channel region of the memory strings may be precharged through the common source line CSL.

At a third time T3, the source select line SSL, the unselected word lines unsel_WL and the selected word line sel_WL may be discharged. The voltage level of the source select line SSL may drop to a ground level and the source select transistor SST may be turned off. The memory strings may be separated from the common source line CSL.

At a fourth time T4, the power supply voltage VDD may be applied to the selected drain select line sel_DSL and the drain select transistors may be turned on. As a result, the selected memory strings may be electrically coupled to the bit line BL.

At a fifth time T5, a program voltage Vpgm may be applied to the selected word line sel_WL. After a voltage of the selected word line sel_WL reaches a pass voltage Vpass, the voltage of the selected word line sel_WL may increase to the program voltage Vpgm. The pass voltage Vpass may be applied to the unselected word lines WL. As a result, selected memory cells of the selected memory string may be programmed. In addition, a channel region of program-inhibited memory strings may be boosted and programming of these memory strings may be inhibited.

At a sixth time T6, the selected word line sel_WL, the unselected word lines unset_WL and the selected drain select line sel_DSL may be discharged.

According to the above-described method, a program operation including a precharge period and a program period may be performed. A period between the first time T1 and the third time T3 may be the precharge period and a period between the fourth time T4 and the sixth time T6 may be the program period. The period between the first time T1 and the third time T3 may correspond to the section B and the section C as described above with reference to FIGS. 5A to 5C. By applying the first voltage V1 to the first source select lines SSL1 of the unselected memory block in the precharge period, the common source line CSL may be charged quickly. Accordingly, the channel region of the memory strings of the selected memory block may be quickly precharged, and program speed may be improved.

Figure 7:
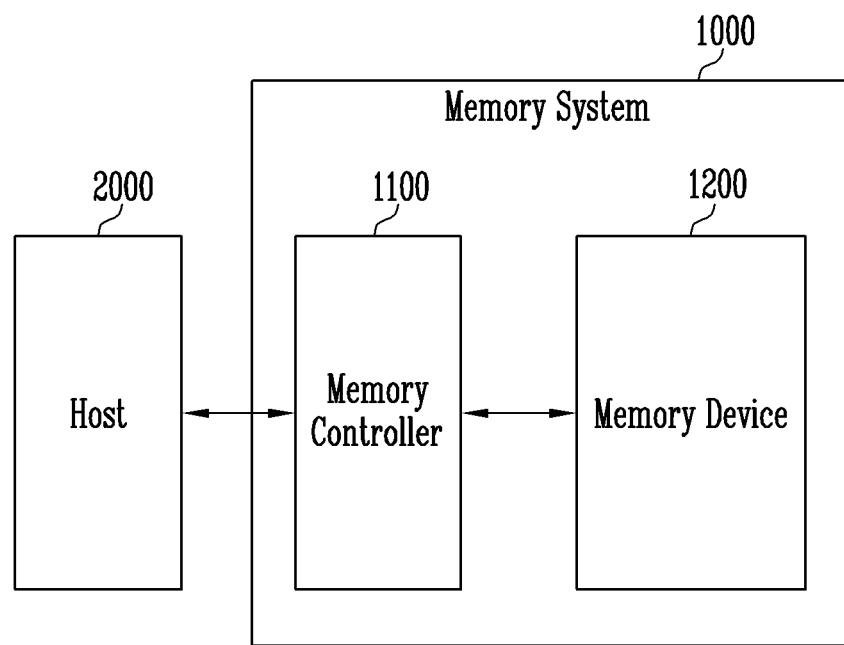
FIG. 7 is a simplified block diagram illustrating a memory system according to an embodiment of the present disclosure.

FIG. 7 is a diagram illustrating a memory system 1000 according to an embodiment of the present disclosure.

Referring to FIG. 7, the memory system 1000 may include a memory device 1200 configured to store data and a memory controller 1100 performing communications between the memory device 1200 and a host 2000.

The host 2000 may be a device or system configured to store data in the memory system 1000 or retrieve data from the memory system 1000. The host 2000 may generate requests for various operations and output the generated requests to the memory system 1000. The requests may, for example, include a program request for a program operation, a read request for a read operation, and an erase request for an erase operation. The host 2000 may communicate with the memory system 1000 by using at least one interface protocol among Peripheral Component Interconnect Express (PCIE), Advanced Technology Attachment (ATA), Serial ATA (SATA), Parallel ATA (PATA), Serial Attached SCSI (SAS), Non-Volatile Memory express (NVMe), Universal Serial Bus (USB), Multi-Media Card (MMC), Enhanced Small Disk Interface (ESDI), and Integrated Drive Electronics (IDE).

The host 2000 may include at least one of a computer, a portable digital device, a tablet, a digital camera, a digital audio player, a television, a wireless communication device, or a cellular phone. However, embodiments of the disclosed technology are not limited thereto.

The memory controller 1100 may control overall operations of the memory system 1000. The memory controller 1100 may control the memory device 1200 in response to the requests of the host 2000. The memory controller 1100 may control the memory device 1200 to perform a program operation, a read operation and an erase operation at the request of the host 2000. Alternatively, the memory controller 1100 may perform a background operation for performance improvement of the memory system 1000 in the absence of the request from the host 2000.

To control the operations of the memory device 1200, the memory controller 1100 may transfer a control signal and a data signal to the memory device 1200. The control signal and the data signal may be transferred to the memory device 1200 through different input/output lines. The data signal may include a command, an address, or data. The control signal may be used to differentiate periods where the data signal is input.

The memory device 1200 may perform a program operation, a read operation and an erase operation in response to control of the memory controller 1100. The memory device 1200 may be a volatile memory that loses data when power supply is blocked, or a non-volatile memory that retains data in the absence of a power supply. According to an embodiment, the memory device 1200 may be the above-described semiconductor device 100, which may be a flash memory device.

At the request for a program, read, or erase operation from the host 2000, the memory controller 1100 may command the memory device 1200 to perform a program, read, or erase operation according to the method as described above with reference to FIGS. 1 to 6. According to this method, a block size may be reduced and cell performance characteristics may be ensured.

Figure 8:
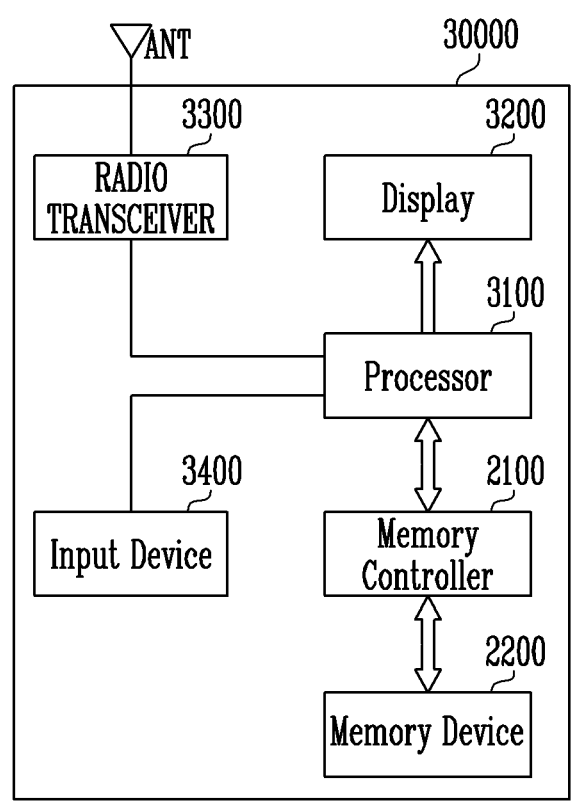
FIG. 8 is a simplified block diagram illustrating a memory system according to an embodiment of the present disclosure.

FIG. 8 is a diagram illustrating a memory system 30000 according to an embodiment of the present disclosure.

Referring to FIG. 8, the memory system 30000 may be embodied into a cellular phone, a smart phone, a tablet, a personal computer (PC), a personal digital assistant (PDA), or a wireless communication device. The memory system 30000 may include a memory device 2200 and a memory controller 2100 controlling the operations of the memory device 2200.

The memory controller 2100 may control a data access operation of the memory device 2200, for example, a program operation, an erase operation or a read operation of the memory device 2200 in response to control of a processor 3100.

The data programmed into the memory device 2200 may be output through a display 3200 in response to control of the memory controller 2100.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the memory controller 2100 or the display 3200. The memory controller 2100 may transfer the signal processed by the processor 3100 into the memory device 2200. In addition, the radio transceiver 3300 may change a signal output from the processor 3100 into a radio signal and output the radio signal to an external device through the antenna ANT. A control signal for controlling the operations of the host or data to be processed by the processor 3100 may be entered by an input device 3400, and the input device 3400 may include a pointing device, such as a touch pad and a computer mouse, a keypad, or a keyboard. The processor 3100 may control the operations of the display 3200 so that data output from the memory controller 2100, data output from the radio transceiver 3300, or data output from an input device 3400 may be output through the display 3200.

According to an embodiment, the memory controller 2100 capable of controlling the operations of the memory device 2200 may be realized as a portion of the processor 3100, or as a separate chip from the processor 3100.

Figure 9:
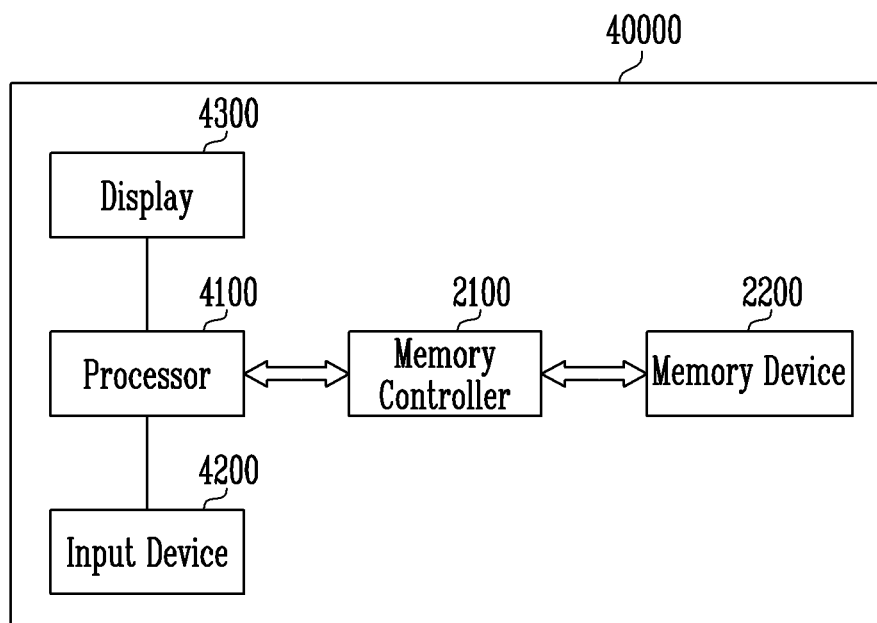
FIG. 9 is simplified block diagram illustrating a memory system according to an embodiment of the present disclosure.

FIG. 9 s a diagram illustrating a memory system 40000 according to an embodiment of the present disclosure.

Referring to FIG. 9, the memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 2200 and the memory controller 2100 controlling a data processing operation of the memory device 2200.

A processor 4100 may output data stored in the memory device 2200 through a display 4300 according to data input through an input device 4200. Examples of the input device 4200 may include a pointing device such as a touch pad, a computer mouse, a keypad, or a keyboard.

The processor 4100 may control overall operations of the memory system 40000 and control operations of the memory controller 2100. According to an embodiment, the memory controller 2100 capable of controlling the operations of the memory device 2200 may be realized as a portion of the processor 4100, or as a separate chip from the processor 4100.

Figure 10:
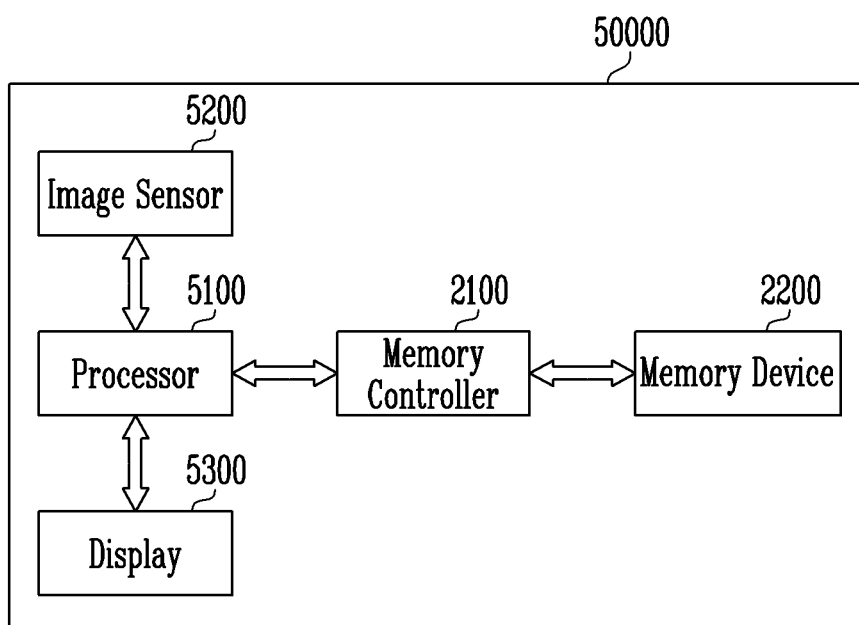
FIG. 10 is a simplified block diagram illustrating a memory system according to an embodiment of the present disclosure.

FIG. 10 is a diagram illustrating a memory system 50000 according to an embodiment of the present disclosure.

Referring to FIG. 10, the memory system 50000 may be embodied into an image processor, for example, a digital camera, a cellular phone with a digital camera attached thereto, a smart phone with a digital camera attached thereto, or a table PC with a digital camera attached thereto.

The memory system 50000 may include the memory device 2200 and the memory controller 2100 controlling a data processing operation of the memory device 2200, for example, a program operation, an erase operation, or a read operation.

An image sensor 5200 of the memory system 50000 may convert an optical image into digital signals. The converted digital signals may be transferred to a processor 5100 or the memory controller 2100. In response to control of the processor 5100, the converted digital signals may be output through the display 5300 or stored in the memory device 2200 through the memory controller 2100. In addition, the data stored in the memory device 2200 may be output through a display 5300 according to control of the processor 5100 or the controller 2100.

According to an embodiment, the memory controller 2100 capable of controlling the operations of the memory device 2200 may be formed as a part of the processor 5100, or a separate chip from the processor 5100.

Figure 11:
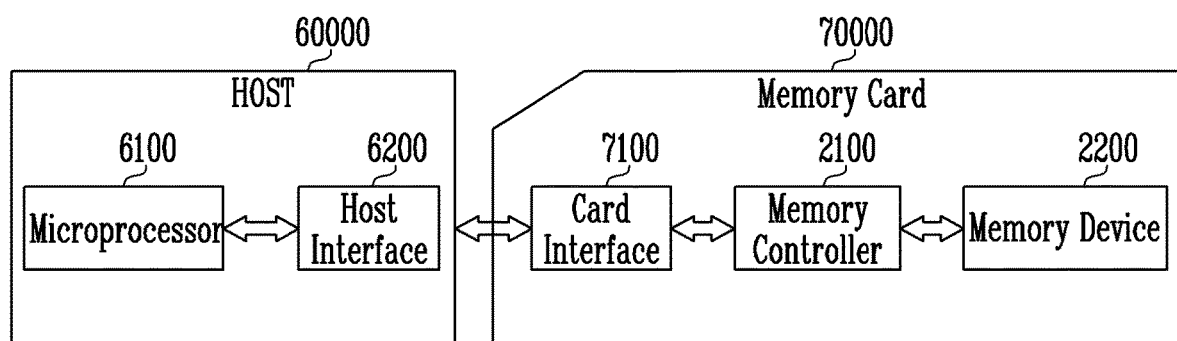
FIG. 11 is a simplified block diagram illustrating a memory system according to an embodiment of the present disclosure.

FIG. 11 is a diagram illustrating a memory system 70000 according to an embodiment of the present disclosure.

Referring to FIG. 11, the memory system 70000 may include a memory card or a smart card. The memory system 70000 may include the memory device 2200, the memory controller 2100, and a card interface 7100.

The memory controller 2100 may control data exchange between the memory device 2200 and the card interface 7100. According to an embodiment, the card interface 7100 may be, but not limited thereto, a secure digital (SD) card interface or a multi-media card (MMC) interface.

The card interface 7100 may interface data exchange between a host 60000 and the memory controller 2100 according to a protocol of the host 60000. According to an embodiment, the card interface 7100 may support a Universal Serial Bus (USB) protocol and an InterChip (IC)-USB protocol. The card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, a console video game hardware, or a digital set-top pox, the host interface 6200 may perform data communication with the memory device 2200 through the card interface 7100 and the memory controller 2100 in response to control of a microprocessor 6100.

According to embodiments of the present disclosure, a semiconductor device having improved operating characteristics and reliability may be provided.

In the above-discussed embodiments, all steps may be selectively performed or skipped. In addition, the steps in each embodiment may not always be performed in regular order. Furthermore, the embodiments disclosed in the present specification and the drawings aim to help those with ordinary knowledge in this art to more clearly understand the present disclosure rather than aiming to limit the bounds of the present disclosure. That is, one of ordinary skill in the art to which the present disclosure belongs will be able to easily understand that various modifications are possible based on the technical scope of the present disclosure. It will be apparent to those skilled in the art that various modifications can be made to the above-described embodiments of the present disclosure without departing from the spirit or scope of the present invention. Thus, it is intended that embodiments of the present disclosure cover all such modifications provided they come within the scope of the appended claims and their equivalents.

What is claimed is:

1. A method of operating a semiconductor device including memory blocks sharing a common source line, each of the memory blocks including memory strings each including a first source select line, a second source select line and memory cells, the method comprising:
   applying a first voltage to a first source select line coupled to first source select transistors of memory strings included in an unselected memory block, among the memory blocks;
   floating the first source select line after the first voltage is applied thereto;
   applying a second voltage having a lower voltage level than the first voltage to a second source select line coupled to second source select transistors of the memory strings included in the unselected memory block;
   applying a precharge voltage to the common source line; and
   applying a program voltage to a word line coupled to selected memory cells of memory strings included in a selected memory block, among the memory blocks.

2. The method of claim 1, wherein the memory strings are coupled between the common source line and bit lines, and the first source select transistors are closer to the common source line than the second source select transistors.

3. The method of claim 1, wherein the second source select transistors are turned off when the second voltage is applied.

4. The method of claim 1, wherein the second voltage has a lower voltage level than threshold voltages of the second source select transistors.

5. The method of claim 1, wherein the first voltage is a positive voltage and the second voltage is a ground voltage.

6. The method of claim 1, wherein the first voltage is a first positive voltage and the second voltage is a second positive voltage.

7. The method of claim 1, wherein a voltage level of the first voltage is equal to or lower than a voltage level of the precharge voltage.

8. The method of claim 1, wherein a level of the common source line is increased to a precharge level when the first voltage is applied to the first source select line and the second voltage is applied to the second source select line.

9. The method of claim 1, wherein the first voltage or the second voltage is applied when the precharge voltage is applied.

10. The method of claim 1, wherein a level of the common source line is increased to a precharge level using capacitance between the first source select line and the common source line.

11. The method of claim 1, wherein the second voltage is applied to the second source select line when the first voltage is applied to the first source select line.

12. The method of claim 1, wherein the second voltage is applied to the second source select line when the first source select line is floated.

13. The method of claim 1, wherein each of the memory strings further includes a third source select transistor coupled between the first source select transistors and the second source select transistors.

14. The method of claim 13, further comprising floating a third source select line coupled to the third source select transistor.

15. The method of claim 13, further comprising floating a third source select line coupled to the third source select transistor when the first voltage is applied to the first source select line and the second voltage is applied to the second source select line.

16. The method of claim 13, further comprising floating a third source select line coupled to the third source select transistor when the first source select line is floated and the second voltage is applied to the second source select line.

17. The method of claim 1, wherein a channel region of the memory strings included in the selected memory block is precharged using the precharge voltage.

18. A method of operating a semiconductor device including memory blocks sharing a common source line, each of the memory blocks including memory strings coupled between the common source line and bit lines, each of the memory strings including a first group of source select transistors, a second group of source select transistors, and memory cells, wherein the first group is coupled between the common source line and the second group, the method comprising:
   applying a positive voltage to a first source select line coupled to a first group of memory strings included in an unselected memory block, among the memory blocks;
   floating the first source select line after the positive voltage is applied thereto;

applying a voltage for turning off the second group to a second source select line coupled to a second group of memory cell strings included in the unselected memory block;

applying a precharge voltage to the common source line; and applying a program voltage to a word line coupled to selected memory cells of memory strings included in a selected memory block, among the memory blocks.

19. A semiconductor device, comprising:
a common source line;
a first memory block including first memory strings coupled between the common source and first bit lines, each of the first memory strings including a first source select transistor, a second source select transistor and memory cells, wherein the first source select transistor is located closer to the common source line than the second source select transistor;
a second memory block including second memory strings coupled between the common source and second bit lines, each of the second memory strings including a third source select transistor, a fourth source select transistor and memory cells, wherein the third source select transistor is located closer to the common source line than the fourth source select transistor;
a peripheral circuit configured to perform a program operation on the first and second memory strings; and
a control logic circuit controlling the peripheral circuit to apply a first voltage to a first source select line coupled to first source select transistors of the first memory strings when the second memory block is selected, float the first source select line after the first voltage is applied thereto, apply a second voltage having a lower voltage level than the first voltage to a second source select line coupled to second source select transistors of the first memory strings, apply a precharge voltage to the common source line, and apply a program voltage to a word line coupled to selected memory cells of the second memory strings.

20. The semiconductor device of claim 19, wherein the first voltage is a positive voltage, the second voltage has a lower voltage level than threshold voltages of the second source select transistors, and the first source select line is located between the common source line and the second source select line.

* * * * *